United States Patent
Brech

(10) Patent No.: US 6,870,219 B2
(45) Date of Patent: Mar. 22, 2005

(54) FIELD EFFECT TRANSISTOR AND METHOD OF MANUFACTURING SAME

(75) Inventor: Helmut Brech, Phoenix, AZ (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/209,816

(22) Filed: Jul. 31, 2002

(65) Prior Publication Data

US 2004/0021175 A1 Feb. 5, 2004

(51) Int. Cl.$^7$ .................. H01L 29/76; H01L 21/336
(52) U.S. Cl. .................. 257/340; 257/335; 257/341; 257/344; 257/365; 438/286; 438/306
(58) Field of Search .................. 257/316, 319, 257/331, 340, 401, 408, 409, 488, 489, 339, 365, 366, 630; 438/454, 217, 231, 232, 288, 289–291, 283, 286, 284

(56) References Cited

U.S. PATENT DOCUMENTS

| | | | |
|---|---|---|---|
| 4,757,362 A | * 7/1988 | Biwa et al. | 257/408 |
| 4,766,474 A | * 8/1988 | Nakagawa et al. | |
| 5,119,149 A | 6/1992 | Weitzel et al. | |
| 5,252,848 A | 10/1993 | Adler et al. | |
| 5,898,198 A | 4/1999 | Herbert et al. | |
| 5,912,490 A | * 6/1999 | Hebert et al. | 257/340 |
| 6,091,110 A | 7/2000 | Hebert et al. | |
| 6,222,229 B1 | 4/2001 | Hebert et al. | |
| 6,448,611 B1 | * 9/2002 | Oh | 257/340 |
| 6,465,845 B1 | * 10/2002 | Baek | 257/343 |

FOREIGN PATENT DOCUMENTS

| | | |
|---|---|---|
| EP | WO 00/49663 | 8/2000 |
| JP | 58137256 | 8/1983 |

OTHER PUBLICATIONS

Fujishima, et al., *A 700V Lateral Power MOSFET with Narrow Gap Double Metal Field Plates Realizing Low On–resistance and Long–term Stability of Performance*, 2001 Int'l Symposium on Power Semiconductor Devices & ICs, Osaka, pp. 255–258.

Lee, et al., *High Performance Extended Drain MOSFETs (EDMOSFETs) with Metal Field Plate*, IEEE, 1999, pp. 249–252.

* cited by examiner

Primary Examiner—Donghee Kang
(74) Attorney, Agent, or Firm—Bryan Cave LLP

(57) ABSTRACT

A field effect transistor includes a drain region (12) having a first portion (18) and a second portion (20), with the second portion being more lightly doped than the first portion. A channel region (14) is adjacent to the second portion and a drain electrode (24) overlies the drain region. A gate electrode (16) overlies the channel region. A shield structure (30) overlies the drain region and has a first section (32) at a first distance (33) from a semiconductor substrate (10) and a second section (34) at a second distance (35) from the semiconductor substrate, the second distance being greater than the first distance. In a particular embodiment the FET includes a shield structure wherein the first and second sections are physically separate. The location of these shield sections may be varied within the FET, and the potential of each section may be independently controlled.

5 Claims, 3 Drawing Sheets

FIELD EFFECT TRANSISTOR AND METHOD OF MANUFACTURING SAME

FIELD OF THE INVENTION

This invention relates generally to electronics, and relates more particularly to field effect transistors and methods of manufacture.

BACKGROUND OF THE INVENTION

A Field Effect Transistor (FET) is a device in which an output current is controlled by manipulating a voltage applied to a gate electrode. Transistors, including FETs, form the building blocks of many active electronic circuits. The performance of a FET is affected by the interplay of a number of device parameters, including capacitance and resistance values between various device components. FETs are optimized through a complex tradeoff of these parameters. The optimization process must also take into account the impact of hot carrier injection (HCI). Existing designs are not flexible enough to separately optimize the gate-to-drain capacitance (Cgd) reduction and the field plate impacting the drift region of the transistor.

The complexity of FET optimization may be illustrated by noting that the inclusion of a field plate designed to simultaneously reduce the Cgd and lower the peak electric field will significantly increase the gate-to-source capacitance (Cgs). Faraday shields have been used to reduce Cgd, but such shields do not necessarily have an impact on the horizontal and vertical electric field components. Accordingly, a need exists for a device structure capable of improving device characteristics and increasing design flexibility to optimize some parameters while minimizing negative impact on others.

BRIEF DESCRIPTION OF THE DRAWINGS

The invention will be better understood from a reading of the following detailed description, taken in conjunction with the accompanying figures in the drawings in which.

Figure 1:
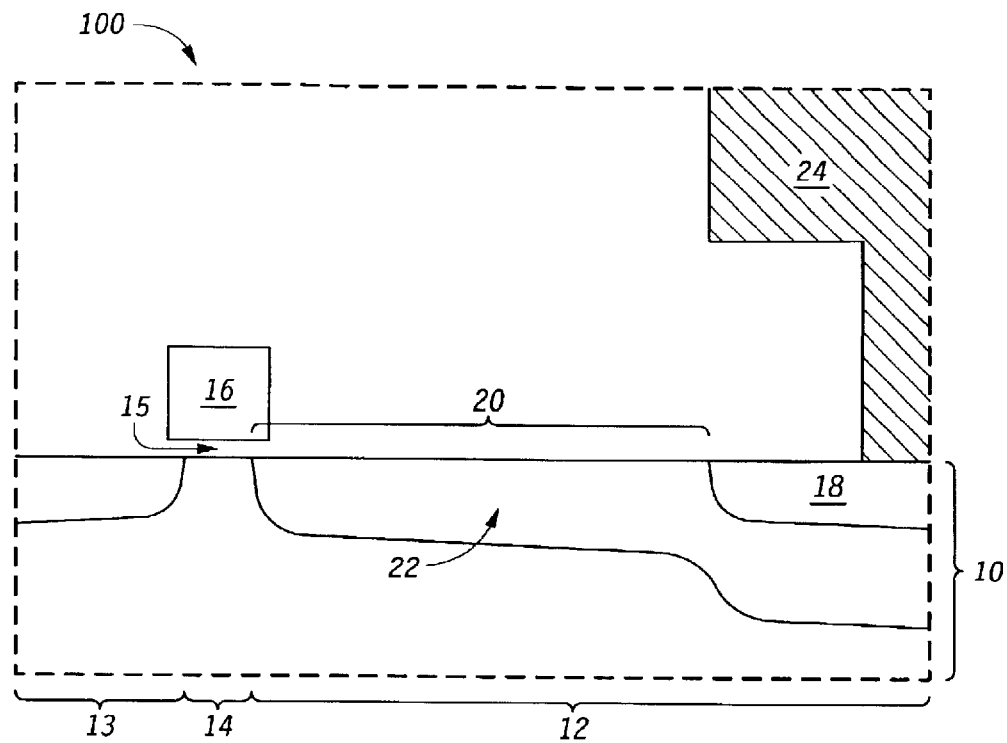
FIG. 1 is a cross-sectional view of a portion of a FET configured according to conventional processing techniques in the prior art.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms first, second, third, fourth, and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein.

The terms left, right, front, back, top, bottom, over, under, and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term coupled, as used herein, is defined as directly or indirectly connected in a mechanical or non-mechanical manner.

DETAILED DESCRIPTION OF THE DRAWINGS

In a particular embodiment of the invention disclosed herein, a FET comprises a double plate structure implemented during its manufacturing process. One part of the plate can be created close enough to the semiconductor so as to impact the peak electric field but far enough away from the gate so as to not significantly increase Cgs. As Cgs is reduced, input impedance increases, in what is a desired result. The second part of the plate is created on top of a thicker dielectric layer to shield the gate from the drain but still far enough away from the gate to not significantly increase Cgs. The invention significantly increases the flexibility of the performance optimization of RF high power devices.

FIG. 1 illustrates a portion of a conventional field effect transistor 100, as known in the art, in which a semiconductor substrate 10 is provided with a drain region 12 and a source region 13 separated by a channel region 14, thus forming a portion of a field effect transistor. As is well known in the art, semiconductor substrate 10 may comprise a silicon layer or a layer of another semiconductor material. As an example, a silicon layer can consist substantially of crystalline silicon that is grown using an epitaxial process.

Referring still to FIG. 1, a gate electrode 16 overlies a gate oxide 15 and channel region 14. The current flowing across channel region 14 may be manipulated by controlling the voltage applied to gate electrode 16. Drain region 12 comprises a first portion 18 and a second portion 20. Second portion 20 comprises a drift region 22 and is more lightly doped than first portion 18. Channel region 14 is adjacent to second portion 20. A drain electrode 24 overlies first portion 18 of drain region 12.

As the dimensions of circuit devices get increasingly smaller, the electric fields between source and drain undergo a corresponding increase. This in turn increases the likelihood that charge carriers will be injected into the gate oxide of the device in a phenomenon known as hot carrier injection, or HCI. If it is left unaddressed, HCI can, in some instances, lead to significant degradation of circuit performance, including circuit failure. Another result of the size reduction of circuit devices is the increase in parasitic capacitance between such circuit devices, which may also lead to significant performance degradation.

These and other problems have been addressed by various techniques that have become well known in the art, such as Faraday shields and field plates. However, as was discussed in a previous section herein, Faraday shields have been effective in decreasing parasitic capacitance but have had little beneficial effect on reducing electric fields so as to reduce HCI, while field plates adapted to reduce the peak electric field tend to increase parasitic capacitance. In other words, the existing solutions tend to solve one problem at the cost of creating or exacerbating a different problem.

Figure 2:
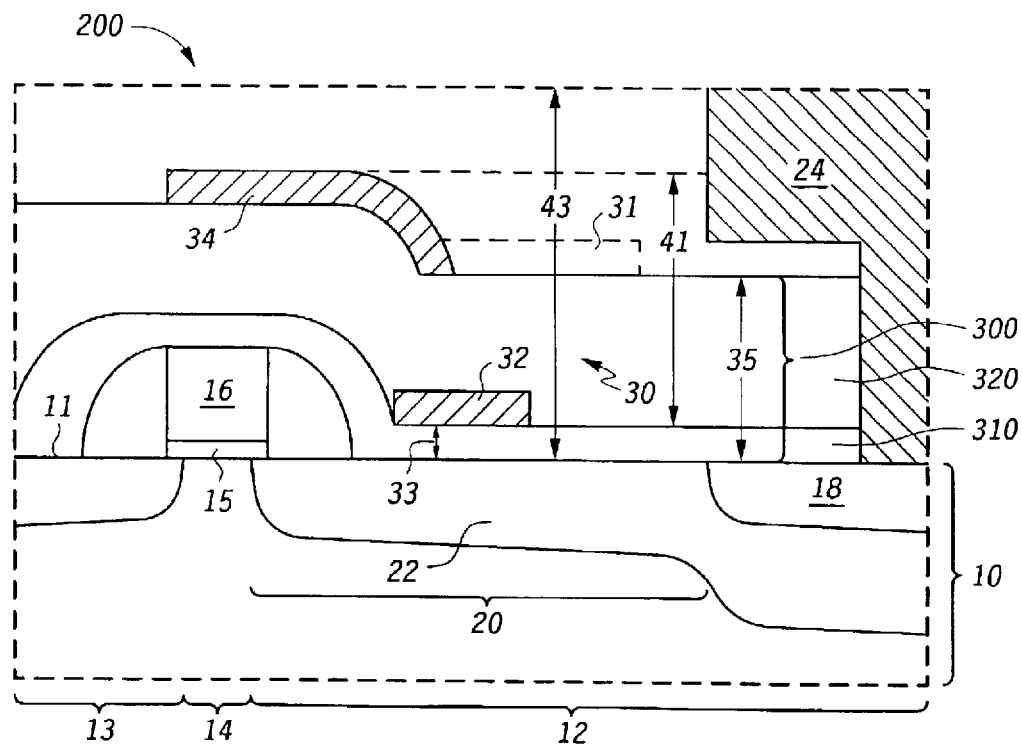
FIG. 2 is a cross-sectional view of a portion of a FET configured in accordance with an embodiment of the present invention.

In order to overcome these and other disadvantages of the prior art, and as illustrated in FIG. 2, a shield structure 30 is provided in a field effect transistor 200. At least a part of shield structure 30 overlies second portion 20 of drain region 12. Shield structure 30, which is electrically conductive, comprises a first section 32 located a first distance 33 from semiconductor substrate 10 and a second section 34 located a second distance 35 from semiconductor substrate 10. In the embodiment illustrated in FIG. 2, first and second sections 32 and 34 are separated from each other to form two distinct pieces. Shield structure 30 is located over and partially within an electrically insulative dielectric stack 300. Electrically insulative dielectric stack 300 is comprised of dielectric layers 310 and 320. The thickness of dielectric layer 310 defines first distance 33, and the combined thicknesses of dielectric layers 310 and 320 and, in the embodiment illustrated in FIG. 2, first section 32 defines second distance 35. Dielectric layers 310 and 320 can have the same or different thicknesses. Accordingly, second distance 35 is greater than first distance 33. In one embodiment, first section 32 of shield structure 30 overlies second portion 20 of drain region 12, while second section 34 of shield structure 30 overlies gate electrode 16 and first section 32. As explained in more detail hereinafter, a particular embodiment locates drain electrode 24 closer to second section 34 than to first section 32 of shield structure 30. This location allows optimal reduction of Cgd, as previously discussed. Shield structure 30 may comprise an electrically conductive solid plate, or it may comprise a grid or other arrangement of conducting strips. Shield structure 30 may comprise a metal, such as, for example, tungsten silicide, or it may comprise another metal, or other electrically conducting material such as a doped semiconductor material. Other suitable materials may also be used, as will be readily apparent to one of ordinary skill in the art.

First distance 33 is chosen such that first section 32 lies close enough to semiconductor substrate 10 that the horizontal and vertical electric field components in drift region 22 are substantially altered during operation of field effect transistor 200, thus reducing HCI. A reduction in HCI reduces the drift of the device. First distance 33 is also chosen such that first section 32 is positioned close enough to semiconductor substrate 10 that the breakdown voltage (BV) between gate electrode 16 and drain electrode 24 can be increased without negatively impacting other parameters. Because a function of second section 34 is to reduce Cgd, second distance 35 is, as mentioned earlier, greater than first distance 33. In a particular embodiment, second distance 35 is approximately three to four times greater than first distance 33. For example, first distance 33 may, in one embodiment, be approximately two hundred nanometers, and second distance 35 may be approximately six hundred to eight hundred nanometers. Other device geometries may have different distance values. First and second distances 33 and 35 are measured along a path beginning at a surface 11 of semiconductor substrate 10 and extending perpendicularly away therefrom. The shortest linear distance separating second section 34 from gate electrode 16 is greater than first distance 33 and, in one embodiment, less than second distance 35. This shortest linear distance, not explicitly shown in the figures, will be referred to as a third distance. Shield structure 30 has a first height 41, and drain electrode 24 has a second height 43. First height 41 is less than second height 43.

Referring still to FIG. 2, in a particular embodiment of the double shield structure, second section 34 of shield structure 30 either fully or partially overlies gate electrode 16 and extends beyond it so as to also at least partially overlie first section 32. As indicated by an optional dashed portion 31 of second section 34, second section 34 may also extend beyond first section 32 toward drain electrode 24 so that drain electrode 24 is closer to second section 34 than to first section 32. In the embodiment illustrated in FIG. 2, gate electrode 16, drain electrode 24, and shield structure 30 each overlie surface 11 of semiconductor substrate 10.

Shield structure 30 may be comprised of separate sections, including first section 32 and second section 34. More specifically, first and second sections 32 and 34 of shield structure 30 may be physically separated, thereby comprising distinct pieces of the FET device. Physically separating first section 32 from second section 34 provides the flexibility to independently locate each section in a manner calculated to optimize the function of the FET. On the other hand, shield structure 30 may also be comprised, in another embodiment, of a single or unitary section wherein first section 32 and second section 34 are coupled together. This embodiment offers at least some of the advantages of the physically-separated embodiment, such as the reduction of HCI and Cgd, but it provides a lesser degree of design flexibility. For example, when first and second sections 32 and 34 are coupled together, no independent biasing of the sections is possible. The biasing of shield structure 30 is more fully discussed hereinafter. In this description of the invention, the shield structure comprising first section 32 and second section 34, whether the sections are coupled or separated, will be referred to as a "double shield" configuration.

For some applications, shield structure 30 may be electrically unbiased. For other applications, it may be desirable to bias shield structure 30. First and second sections 32 and 34 of shield structure 30 are, in one embodiment, electrically coupled to a ground potential. In another embodiment, first and second sections 32 and 34 are separately biased to differing potentials. This may be important, for example, when a low on-resistance is desired. In general, to achieve a lower on-resistance, the higher the threshold voltage is, the higher the bias should be on first section 32. In a particular embodiment, first section 32 is electrically coupled to a predetermined potential approximately equal to a threshold voltage for the FET, and second section 34 is electrically coupled to a ground potential.

Figure 3:
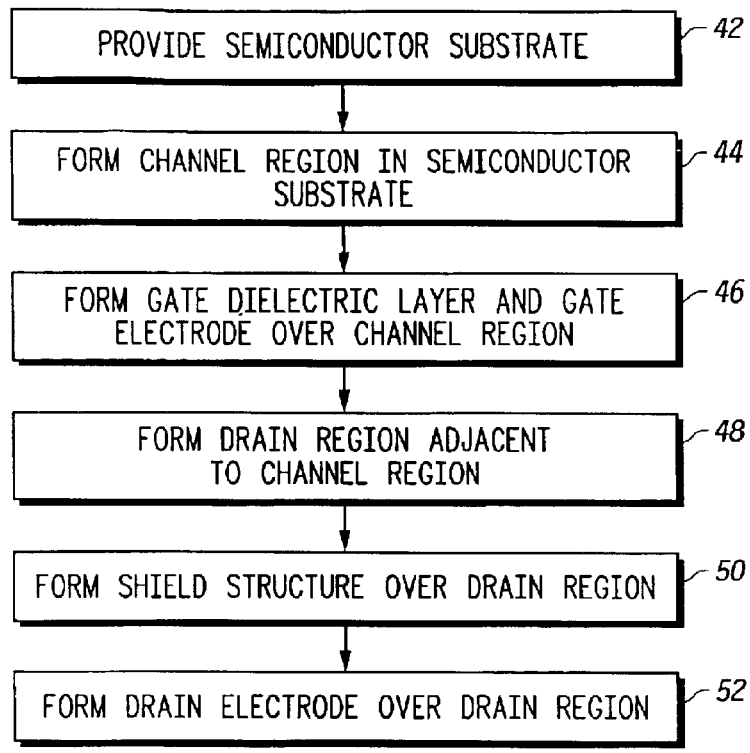
FIG. 3 is a flow diagram illustrating a method of forming a device configured in accordance with an embodiment of the present invention.

The double shield configuration may be produced with only minor modifications to existing process steps. FIG. 3 illustrates a method 40 of producing a particular embodiment of a FET having the double shield configuration in accordance with one embodiment of the invention. A first step 42 of method 40 is to provide a semiconductor substrate. A second step 44 of method 40, which is an optional step, can form a channel region in the semiconductor substrate. A third step 46 of method 40 is to form a gate dielectric layer and a gate electrode over the channel region. A fourth step 48 of method 40 is to form a drain region in the semiconductor substrate adjacent to the channel region, wherein the drain region has a first portion and a second portion, with the second portion more lightly doped than the first portion. In a fifth step 50 of method 40, an electrically conductive shield structure is formed over the second portion of the drain region, the shield structure having a first section at a first distance from the semiconductor substrate and a second section at a second distance from the semiconductor substrate greater than the first distance. A sixth step 52 of method 40 is to form a drain electrode over the first portion of the drain region. As illustrated in method 40, the drain electrode and the shield structure are formed during different steps. In other embodiments of method 40, the electrically conductive shield structure may be formed before, after, or simultaneously with the formation of the drain electrode.

Figure 4:
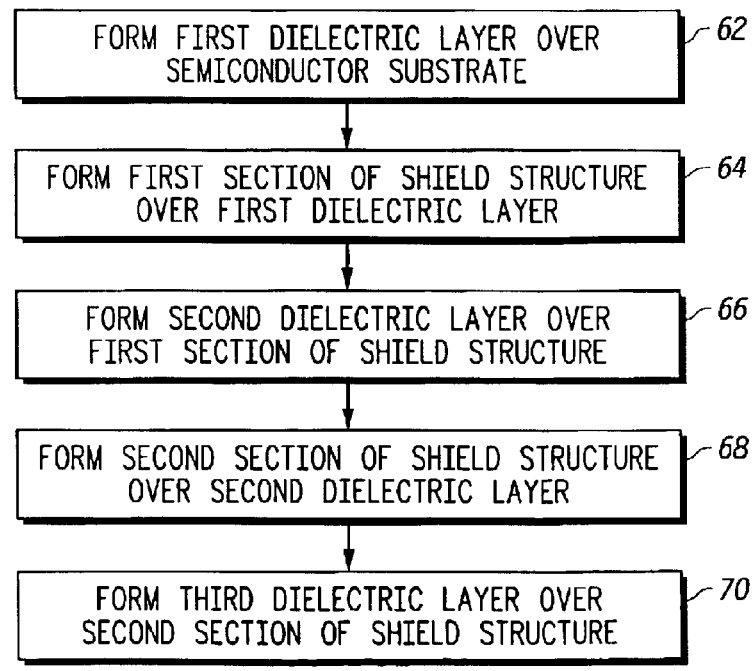
FIG. 4 is a flow diagram illustrating a method of forming an electrically conductive shield structure configured according to an embodiment of the present invention.

FIG. 4 illustrates a method 60 of forming the electrically conductive shield structure that is formed in fifth step 50 of method 40. A first step 62 of method 60 is to form a first dielectric layer over the semiconductor substrate and the gate electrode. As is well known in the art, the formation of dielectric layers conventionally can include depositing and patterning a dielectric material, etching away unwanted portions, planarizing the dielectric material, and other steps in accordance with standard processing techniques. The dielectric layers formed by method 60 may be oxide or nitride layers, or may comprise some other dielectric material. As an example, the oxide layer can consist substantially of silicon dioxide that is thermally grown in an oxidation furnace or that is deposited by a chemical vapor deposition process. As other examples, the oxide layer can consist substantially of tetra-ethyl-ortho-silicate (TEOS) or phosphosilicate glass that is deposited by a chemical vapor deposition process, or an oxide layer can consist substantially of silicon oxy-nitride that is also deposited by a chemical vapor deposition process. Furthermore, the oxide layer can comprise a high dielectric constant material such as, for example, hafnium oxide. A nitride layer, as an example, can consist substantially of silicon nitride that is deposited by a chemical vapor deposition process. As another example, a nitride layer can consist substantially of silicon oxy-nitride that is also deposited by a chemical vapor deposition process.

Referring still to FIG. 4, a second step 64 of method 60 is to form the first section of the shield structure over the first dielectric layer. A third step 66 of method 60 is to form a second dielectric layer over the first section of the shield structure. In a fourth step 68 of method 60, a second section of the shield structure is formed over the second dielectric layer. Method 60 may include an optional fifth step 70 in which a third dielectric layer is formed over the second section of the shield structure.

Figure 5:
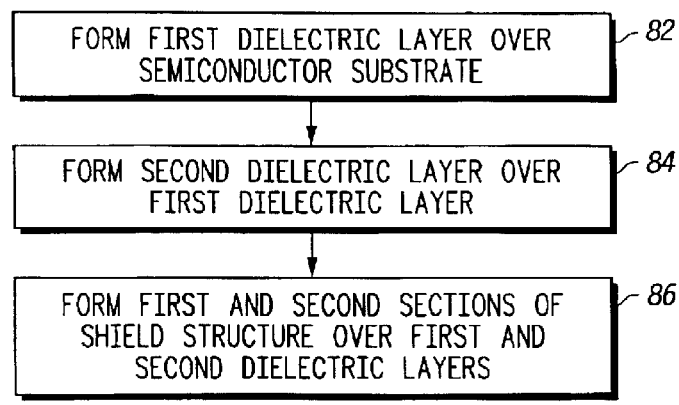
FIG. 5 is a flow diagram illustrating a method of forming a device configured in accordance with another embodiment of the present invention.

In an alternate embodiment, as illustrated in FIG. 5, method 60 may be replaced with a method 80 having a first step 82 in which a first dielectric layer is formed over the semiconductor substrate. A second step 84 of method 80 is to form a second dielectric layer over the first dielectric layer. A third step 86 of method 80 is to form the first and second sections of the electrically conductive shield structure over the first and second dielectric layers. Method 80 forms an embodiment of the double shield structure in which the first and second sections are physically coupled together, as illustrated in FIG. 6, to form a continuous or unitary structure.

Figure 6:
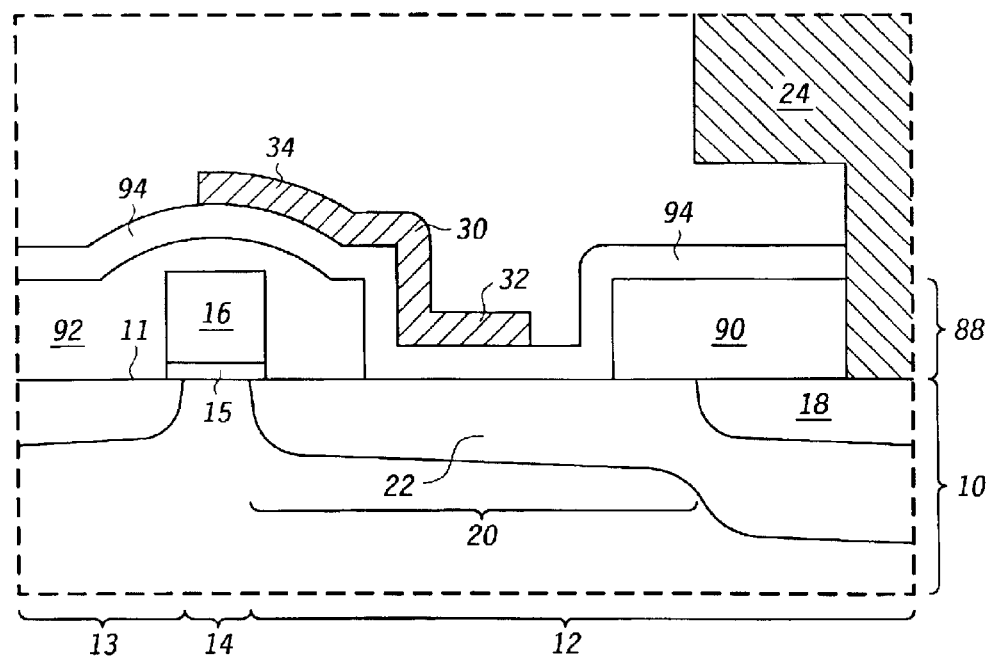
FIG. 6 is a cross-sectional view of a portion of a FET configured in accordance with another embodiment of the present invention.

Referring now to FIG. 6, an embodiment of the double shield configuration is illustrated wherein first section 32 and second section 34 of shield structure 30 are couple together to form a unitary structure. The need for shield structure 30 to be simultaneously close to surface 11 and far away from gate electrode 16 has already been discussed herein. In the unitary structure embodiment of FIG. 6, this need is achieved by splitting up a thick inter-layer dielectric (ILD) 88 into a first piece 90 over drift region 22 and drain region 12 and a second piece 92 over source region 13 and channel region 14. This may be accomplished by masking and etching a portion of thick ILD 88 after it is deposited so as to remove thick ILD 88 from the area between first and second pieces 90 and 92. As has been explained in connection with FIG. 5, a thin ILD 94 is then deposited on top of thick ILD 88. Shield structure 30 is formed over thick ILD 88 and thin ILD 94. This embodiment simultaneously places first section 32 of shield structure 30 appropriately near surface 11 and second section 34 appropriately far from gate electrode 16, as desired. It does not, however, allow independent biasing of first section 32 and second section 34, nor, because of its lack of flexibility, does it lend itself easily to general configurations.

The foregoing discussion has described particular embodiments of a double plate structure implemented during the manufacturing process of a FET. As has been described, one part of the plate can be created close enough to the semiconductor so as to impact the peak electric field but far enough away from the gate so as to not significantly increase Cgs. The second part of the plate is created on top of a thicker dielectric layer to shield the gate from the drain to reduce Cgd but still far enough away from the gate to not significantly increase Cgs.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the double shield configuration discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Furthermore, the terms "comprise," "include," "have," and any variations thereof, are intended to cover a non-exclusive inclusion, such that a process, method, article, or apparatus that comprises a list of elements does not include only those elements, but may include other elements not expressly listed or inherent to such process, method, article, or apparatus.

Moreover, embodiments and limitations disclosed herein are not dedicated to the public under the doctrine of dedication if the embodiments and/or limitations: (1) are not expressly claimed in the claims and (2) are or are potentially equivalents of express elements and/or limitations in the claims under the doctrine of equivalents.

What is claimed is:

1. A field effect transistor comprising:
a semiconductor substrate having a surface;
a drain region in the semiconductor substrate and having a first portion and a second portion more lightly doped than the first portion;
a channel region in the semiconductor substrate and adjacent to the second portion of the drain region;
a gate electrode overlying the channel region and located over the surface of the semiconductor substrate;
a drain electrode overlying the first portion of the drain region and located over the surface of the semiconductor substrate; and
an electrically conductive shield structure overlying the second portion of the drain region,
wherein:
the electrically conductive shield structure comprises:
a first section at a first distance from the semiconductor substrate; and
a second section at a second distance from the semiconductor substrate and at a third distance from the gate electrode;
at least a portion of the electrically conductive shield structure overlies at least a portion of the gate electrode;
the first section and the second section are electrically biased;
the second distance is greater than the first distance;
the third distance is greater than the first distance; and
the drain electrode is closer to the second section of the electrically conductive shield structure than to the first section of the electrically conductive shield structure.

2. A field effect transistor comprising:
a semiconductor substrate;
a drain region in the semiconductor substrate and having a first portion and a second portion more lightly doped than the first portion;
a channel region in the semiconductor substrate and adjacent to the second portion of the drain region;
a gate electrode overlying the channel region;
a drain electrode overlying the first portion of the drain region; and
an electrically conductive shield structure overlying the second portion of the drain region, having a first section at a first distance from the semiconductor substrate, and having a second section at a second distance from the semiconductor substrate, the second distance greater than the first distance,
wherein:
the first and second sections of the electrically conductive shield structure are separately biased;
the first section of the electrically conductive shield structure is electrically coupled to a predetermined potential approximately equal to a threshold voltage for the field effect transistor; and
the second section of the electrically conductive shield structure is electrically coupled to a ground potential.

3. A field effect transistor comprising:
a semiconductor substrate having a surface;
a drain region in the semiconductor substrate and having a first portion and a second portion more lightly doped than the first portion;
a channel region in the semiconductor substrate and adjacent to the second portion of the drain region;
a gate electrode over the surface of the semiconductor substrate and over the channel region;
a drain electrode over the surface of the semiconductor substrate and over the first portion of the drain region; and
an electrically conductive shield structure having a first section and a second section,
wherein:
the first section and the second section of the electrically conductive shield structure are electrically biased;
the first section of the electrically conductive shield structure is over the second portion of the drain region;
the first section of the electrically conductive shield structure is at a first distance from the surface of the semiconductor substrate;
the second section of the electrically conductive shield structure is over the gate electrode;
the second section of the electrically conductive shield structure is at a second distance from the surface of the semiconductor substrate and at a third distance from the gate electrode;
the first and second distances are measured along paths perpendicular to the surface of the semiconductor substrate;
the first distance is less than the second distance;
the third distance is greater than the first distance;
the third distance is less than the second distance; and
the drain electrode is closer to the second section of the electrically conductive shield structure than the first section of the electrically conductive shield structure.

4. A field effect transistor comprising:
a semiconductor substrate having a surface;
a drain region in the semiconductor substrate and having a first portion and a second portion more lightly doped than the first portion;
a channel region in the semiconductor substrate and adjacent to the second portion of the drain region;
a gate electrode over the surface of the semiconductor substrate and over the channel region;
a drain electrode over the surface of the semiconductor substrate and over the first portion of the drain region; and
an electrically conductive shield structure having a first section and a second section,
wherein:
the first section and the second section of the electrically conductive shield structure are electrically biased;
the first section of the electrically conductive shield structure is over the second portion of the drain region;
the first section of the electrically conductive shield structure is at a first distance from the surface of the semiconductor substrate;
the second section of the electrically conductive shield structure is over the gate electrode;
the second section of the electrically conductive shield structure is at a second distance from the surface of the semiconductor substrate and at a third distance from the gate electrode;
the first and second distances are measured along paths perpendicular to the surface of the semiconductor substrate;

the first distance is less than the second distance;
the third distance is greater than the first distance;
the third distance is less than the second distance;
the second section of the electrically conductive shield structure is also over the first section of the electrically conductive shield structure; and
the drain electrode is closer to the second section of the electrically conductive shield structure than the first section of the electrically conductive shield structure.

5. A field effect transistor comprising:

a semiconductor substrate having a surface;

a drain region in the semiconductor substrate and having a first portion and a second portion more lightly doped than the first portion;

a channel region in the semiconductor substrate and adjacent to the second portion of the drain region;

a gate electrode over the surface of the semiconductor substrate and over the channel region;

a drain electrode over the surface of the semiconductor substrate and over the first portion of the drain region; and an electrically conductive shield structure having a first section and a second section, wherein:
the first section of the electrically conductive shield structure is over the second portion of the drain region;
the first section of the electrically conductive shield structure is t a first distance from the surface of the semiconductor substrate;
the second section of the electrically conductive shield structure is over the gate electrode;
the second section of the electrically conductive shield structure is at a second distance from the surface of the semiconductor substrate;
the first distance is less than the second distance;
the first section of the electrically conductive shield structure is electrically coupled to a predetermined potential approximately equal to a threshold voltage for the field effect transistor; and
the second section of the electrically conductive shield structure is electrically coupled to a ground potential.

* * * * *

UNITED STATES PATENT AND TRADEMARK OFFICE
CERTIFICATE OF CORRECTION

| | |
|---|---|
| PATENT NO. | : 6,870,219 B2 |
| APPLICATION NO. | : 10/209816 |
| DATED | : March 22, 2005 |
| INVENTOR(S) | : Helmut Brech |

It is certified that error appears in the above-identified patent and that said Letters Patent is hereby corrected as shown below:

Column 10, Line 8, Claim No. 5:

Change "t" to --at--

Claims 31-50 as filed in the amendment of September 20, 2004, were left off of the patent and should be added as claims 6-25 as follows:

--Claim 6. The field effect transistor of claim 1 wherein:

the electrically conductive shield structure has a pattern selected from the group consisting of: a grid pattern and a stripe pattern.

Claim 7. The field effect transistor of claim 1 wherein:

a height of the electrically conductive shield structure from the surface of the semiconductor substrate is less than a height of the drain electrode from the surface of the semiconductor substrate.

Claim 8. The field effect transistor of claim 1 wherein:

the electrically conductive shield structure is absent over the first portion of the drain region.

Claim 9. The field effect transistor of claim 1 wherein:

the gate electrode is devoid of being electrically shorted to the electrically conductive shield structure; and the drain electrode is devoid of being electrically shorted to the electrically conductive shield structure.

UNITED STATES PATENT AND TRADEMARK OFFICE
CERTIFICATE OF CORRECTION

PATENT NO. : 6,870,219 B2
APPLICATION NO. : 10/209816
DATED : March 22, 2005
INVENTOR(S) : Helmut Brech It is certified that error appears in the above-identified patent and that said Letters Patent is hereby corrected as shown below:

Claim 10. The field effect transistor of claim 1 wherein:

the first and second sections are physically separated from each other;

a portion of the first section overlies at least a portion of the second portion of the drain region;

a portion of the second section overlies at least a portion of the first section;

the portion of the second section overlies at least a portion of the second portion of the drain region; and a different portion of the second section overlies at least a portion of the gate electrode.

Claim 11. The field effect transistor of claim 10 wherein:

the second section extends beyond the first section in a direction across the surface of the semiconductor substrate and toward the gate electrode.

Claim 12. The field effect transistor of claim 10 wherein:

the second section extends beyond the first section in a direction across the surface of the semiconductor substrate and toward the drain electrode.

Claim 13. The field effect transistor of claim 12 wherein:

the second section extends beyond the first section in a direction across the surface of the semiconductor substrate and toward the gate electrode.

UNITED STATES PATENT AND TRADEMARK OFFICE
CERTIFICATE OF CORRECTION

| | |
|---|---|
| PATENT NO. | : 6,870,219 B2 |
| APPLICATION NO. | : 10/209816 |
| DATED | : March 22, 2005 |
| INVENTOR(S) | : Helmut Brech |

It is certified that error appears in the above-identified patent and that said Letters Patent is hereby corrected as shown below:

Claim 14. The field effect transistor of claim 1 wherein:

the second distance is approximately three to four times greater than the first distance.

Claim 15. The field effect transistor of claim 1 wherein:

the first distance is approximately two hundred nanometers; and the second distance is approximately six hundred to eight hundred nanometers.

Claim 16. A field effect transistor comprising:

a semiconductor substrate having a surface;

a drain region in the semiconductor substrate and having a first portion and a second portion more lightly doped than the first portion;

a channel region in the semiconductor substrate and adjacent to the second portion of the drain region;

a gate electrode overlying the channel region and located over the surface of the semiconductor substrate;

a drain electrode overlying the first portion of the drain region and located over the surface of the semiconductor substrate; and

UNITED STATES PATENT AND TRADEMARK OFFICE
CERTIFICATE OF CORRECTION

| | |
|---|---|
| PATENT NO. | : 6,870,219 B2 |
| APPLICATION NO. | : 10/209816 |
| DATED | : March 22, 2005 |
| INVENTOR(S) | : Helmut Brech |

It is certified that error appears in the above-identified patent and that said Letters Patent is hereby corrected as shown below:

Claim 16 (cont'd).

an electrically conductive shield structure overlying the second portion of the drain region, wherein:

the electrically conductive shield structure comprises:

a first section at a first distance from the semiconductor substrate; and a second section at a second distance from the semiconductor substrate and at a third distance from the gate electrode;

the first and second sections are physically separated from each other;

a portion of the first section overlies at least a portion of the second portion of the drain region;

a portion of the second section overlies at least a portion of the first section;

the portion of the second section overlies at least a portion of the second portion of the drain region;

a different portion of the second section overlies at least a portion of the gate electrode;

the first section and the second section are electrically biased;

the second distance is greater than the first distance;

UNITED STATES PATENT AND TRADEMARK OFFICE
CERTIFICATE OF CORRECTION

| | | |
|---|---|---|
| PATENT NO. | : 6,870,219 B2 | |
| APPLICATION NO. | : 10/209816 | |
| DATED | : March 22, 2005 | |
| INVENTOR(S) | : Helmut Brech | |

It is certified that error appears in the above-identified patent and that said Letters Patent is hereby corrected as shown below:

Claim 16 (cont'd).

the third distance is greater than the first distance; and either: (a) the drain electrode is closer to the second section of the electrically conductive shield structure than to the first section of the electrically conductive shield structure; or (2) the drain electrode is absent over the first portion of the electrically conductive shield structure.

Claim 17. The field effect transistor of claim 16 wherein:

the second section extends beyond the first section in a direction across the surface of the semiconductor substrate and toward the drain electrode.

Claim 18. The field effect transistor of claim 17 wherein:

the second section extends beyond the first section in a direction across the surface of the semiconductor substrate and toward the gate electrode.

Claim 19. The field effect transistor of claim 16 wherein:

the second section extends beyond the first section in a direction across the surface of the semiconductor substrate and toward the gate electrode.

Claim 20. The field effect transistor of claim 19 wherein:

the electrically conductive shield structure has a pattern selected from the group consisting of: a grid pattern and a stripe pattern.

UNITED STATES PATENT AND TRADEMARK OFFICE
CERTIFICATE OF CORRECTION

PATENT NO. : 6,870,219 B2
APPLICATION NO. : 10/209816
DATED : March 22, 2005
INVENTOR(S) : Helmut Brech It is certified that error appears in the above-identified patent and that said Letters Patent is hereby corrected as shown below:

Claim 21. The field effect transistor of claim 19 wherein:

a height of the electrically conductive shield structure from the surface of the semiconductor substrate is less than a height of the drain electrode from the surface of the semiconductor substrate.

Claim 22. The field effect transistor of claim 21 wherein:

the electrically conductive shield structure is absent over the first portion of the drain region.

Claim 23. The field effect transistor of claim 21 wherein:

the gate electrode is devoid of being electrically shorted to the electrically conductive shield structure; and the drain electrode is devoid of being electrically shorted to the electrically conductive shield structure.

Claim 24. The field effect transistor of claim 21 wherein:

the second distance is approximately three to four times greater than the first distance.

UNITED STATES PATENT AND TRADEMARK OFFICE
CERTIFICATE OF CORRECTION

PATENT NO. : 6,870,219 B2
APPLICATION NO. : 10/209816
DATED : March 22, 2005
INVENTOR(S) : Helmut Brech It is certified that error appears in the above-identified patent and that said Letters Patent is hereby corrected as shown below:

Claim 25. The field effect transistor of claim 24 wherein:

the second distance is approximately six hundred to eight hundred nanometers.--

Signed and Sealed this

Twenty-second Day of May, 2007

JON W. DUDAS
*Director of the United States Patent and Trademark Office*